(12) United States Patent
Zi et al.

(10) Patent No.: US 11,934,101 B2
(45) Date of Patent: Mar. 19, 2024

(54) PHOTORESIST COMPOSITION AND METHOD OF FORMING PHOTORESIST PATTERN

(71) Applicant: TAIWAN SEMICONDUCTOR MANUFACTURING CO., LTD., Hsinchu (TW)

(72) Inventors: An-Ren Zi, Hsinchu (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 320 days.

(21) Appl. No.: 17/094,706

(22) Filed: Nov. 10, 2020

(65) Prior Publication Data
US 2021/0157233 A1 May 27, 2021

Related U.S. Application Data

(60) Provisional application No. 62/941,486, filed on Nov. 27, 2019.

(51) Int. Cl.
*G03F 7/004* (2006.01)
*G03F 7/30* (2006.01)
(Continued)

(52) U.S. Cl.
CPC .............. *G03F 7/30* (2013.01); *G03F 7/0042* (2013.01); *G03F 7/0043* (2013.01);
(Continued)

(58) Field of Classification Search
CPC . G03F 7/30; G03F 7/40; G03F 7/0042; G03F 7/0043; G03F 7/0045
See application file for complete search history.

(56) References Cited

U.S. PATENT DOCUMENTS 8,796,666 B1 8/2014 Huang et al.
9,093,530 B2 7/2015 Huang et al.
(Continued)

FOREIGN PATENT DOCUMENTS

TW 201336786 A 9/2013
TW 201918496 A 5/2019

*Primary Examiner* — John S Chu
(74) *Attorney, Agent, or Firm* — STUDEBAKER & BRACKETT PC

(57) ABSTRACT

A method of forming a photoresist pattern includes forming a photoresist layer including a photoresist composition over a substrate. The photoresist composition includes metal particles and a thermally stable ligand attached to the metal particles. The thermally stable ligand includes branched or unbranched, cyclic or non-cyclic, C1-C7 alkyl groups or C1-C7 fluoroalkyl groups. The C1-C7 alkyl or C1-C7 fluoroalkyl groups include one or more of —$CF_3$, —SH, —OH, =O, —S—, —P—, —$PO_2$, —C(=O)SH, —C(=O)OH, —C(=O)O—, —O—, —N—, —C(=O)NH, —$SO_2$OH, —$SO_2$SH, —SOH, or —$SO_2$—. The photoresist layer is selectively exposed to actinic radiation, and the photoresist layer is developed to form a pattern in the photoresist layer. In an embodiment, the method includes heating the photoresist layer before selectively exposing the photoresist layer to actinic radiation.

20 Claims, 21 Drawing Sheets

(51) Int. Cl.
*G03F 7/40* (2006.01)
*H01L 21/027* (2006.01)

(52) U.S. Cl.
CPC .......... *G03F 7/0044* (2013.01); *G03F 7/0045* (2013.01); *G03F 7/40* (2013.01); *H01L 21/0274* (2013.01)

(56) References Cited

U.S. PATENT DOCUMENTS

| | | |
|---|---|---|
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,696,624 B2 * | 7/2017 | Thackeray ............ G03F 7/0046 |
| 9,857,684 B2 | 1/2018 | Lin et al. |
| 9,859,206 B2 | 1/2018 | Yu et al. |
| 9,875,892 B2 | 1/2018 | Chang et al. |
| 10,228,618 B2 * | 3/2019 | Meyers ................ G03F 7/16 |
| 2015/0234272 A1 * | 8/2015 | Sarma .................. G03F 7/0045 430/326 |
| 2019/0129301 A1 * | 5/2019 | Voorthuijzen .......... G03F 7/039 |
| 2019/0146342 A1 * | 5/2019 | Zi ........................ G03F 7/2002 430/270.1 |
| 2021/0294212 A1 * | 9/2021 | Zi ............................. G03F 7/11 |

\* cited by examiner

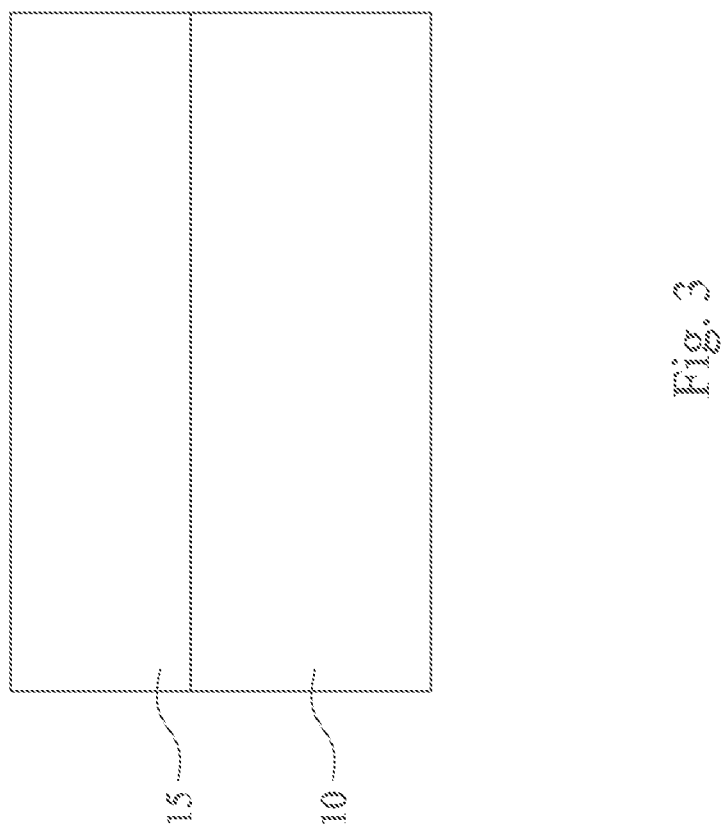

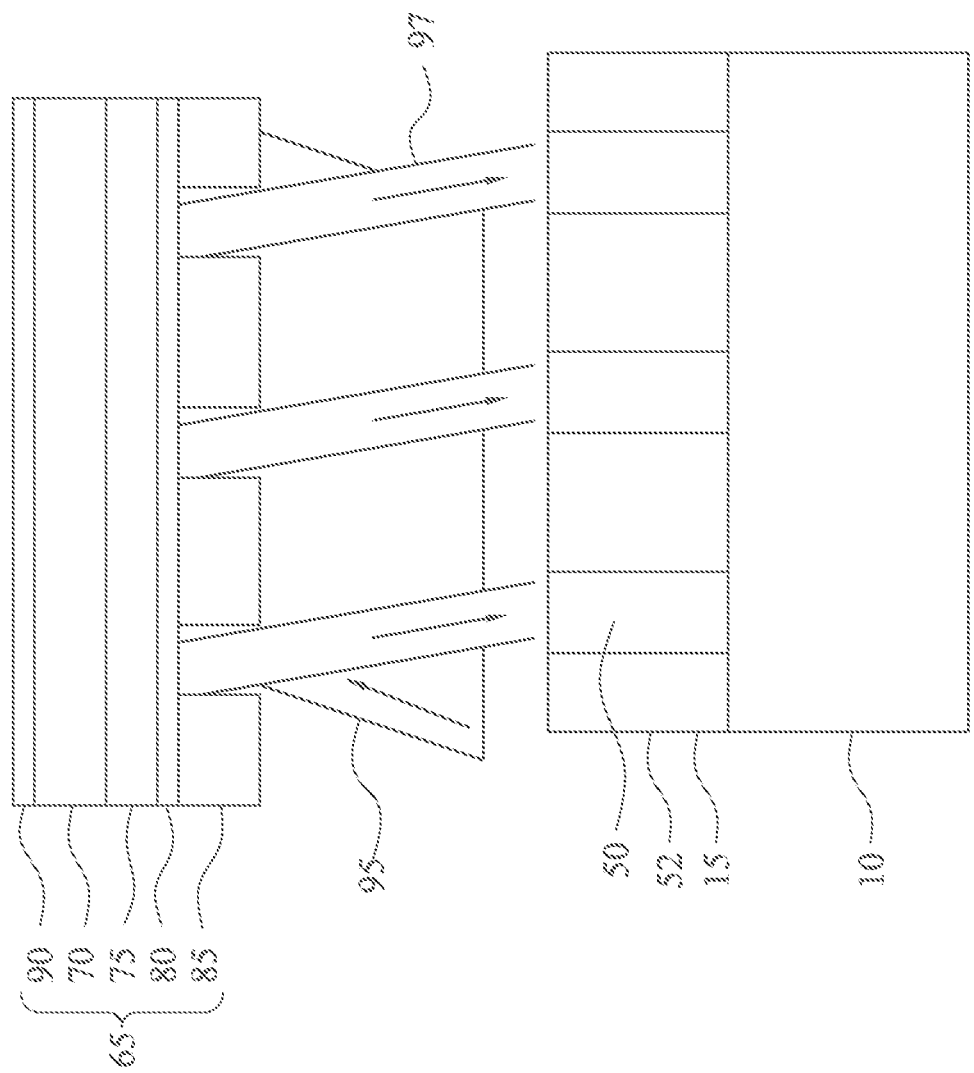

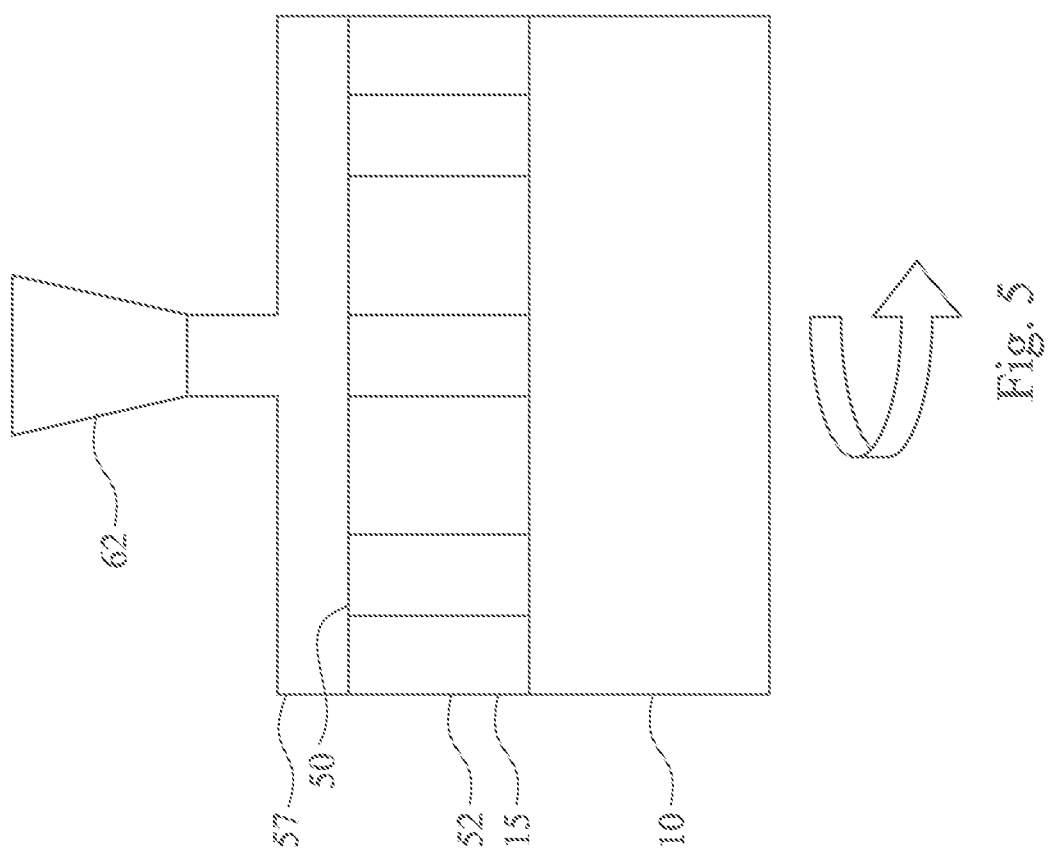

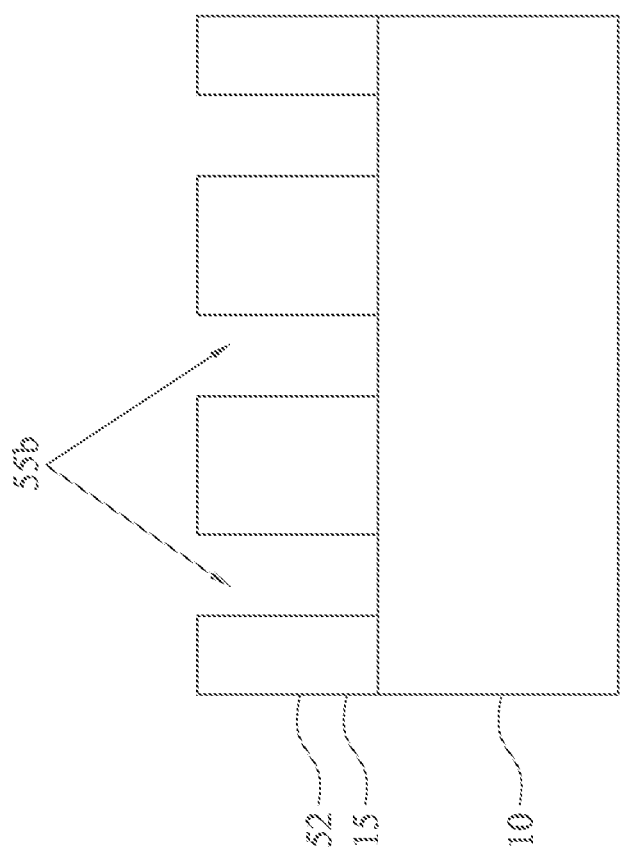

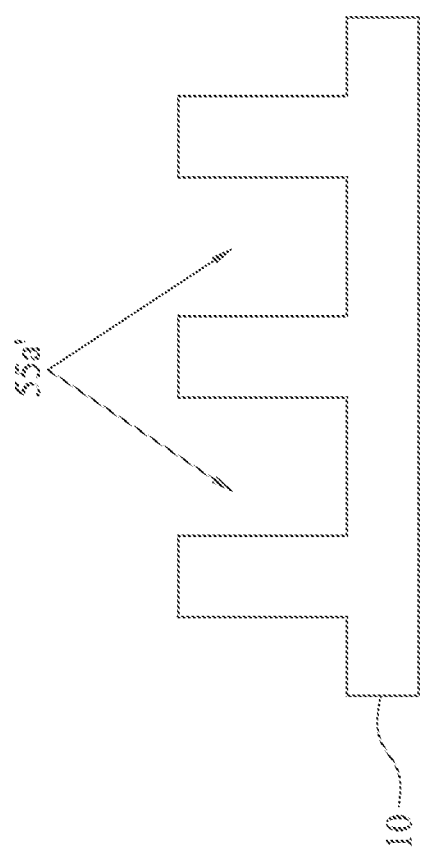

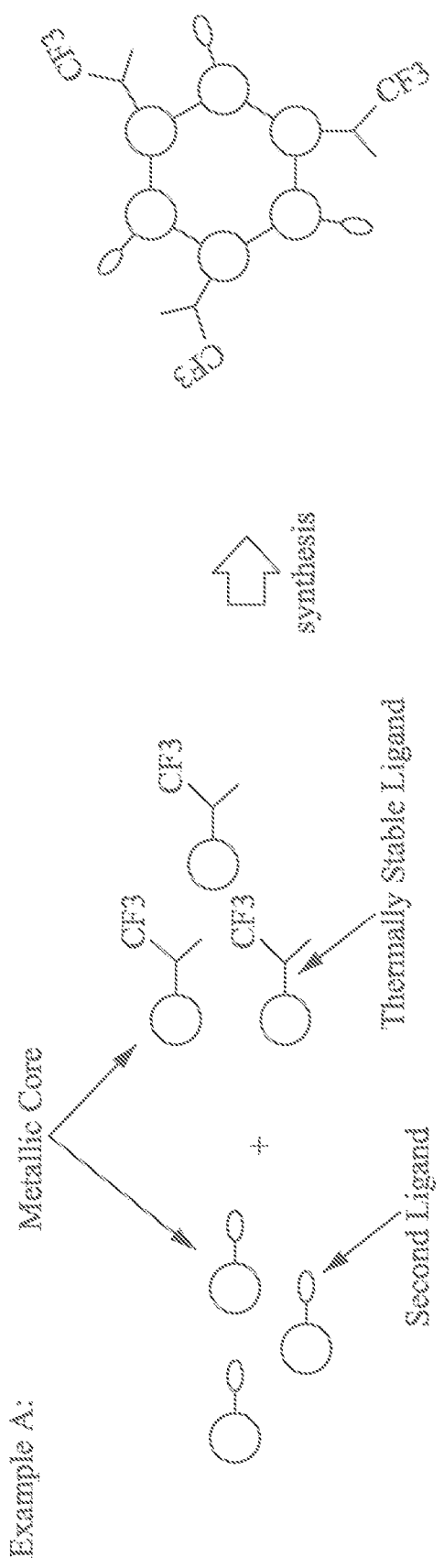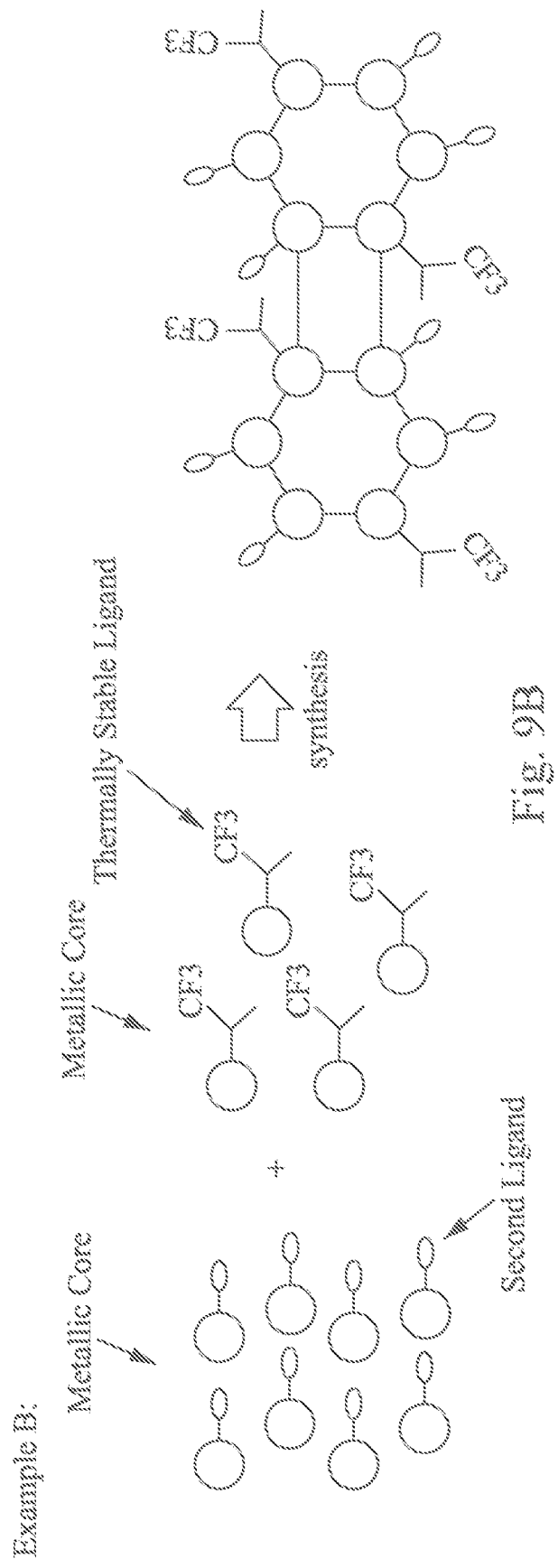
Fig. 9A
Fig. 9B

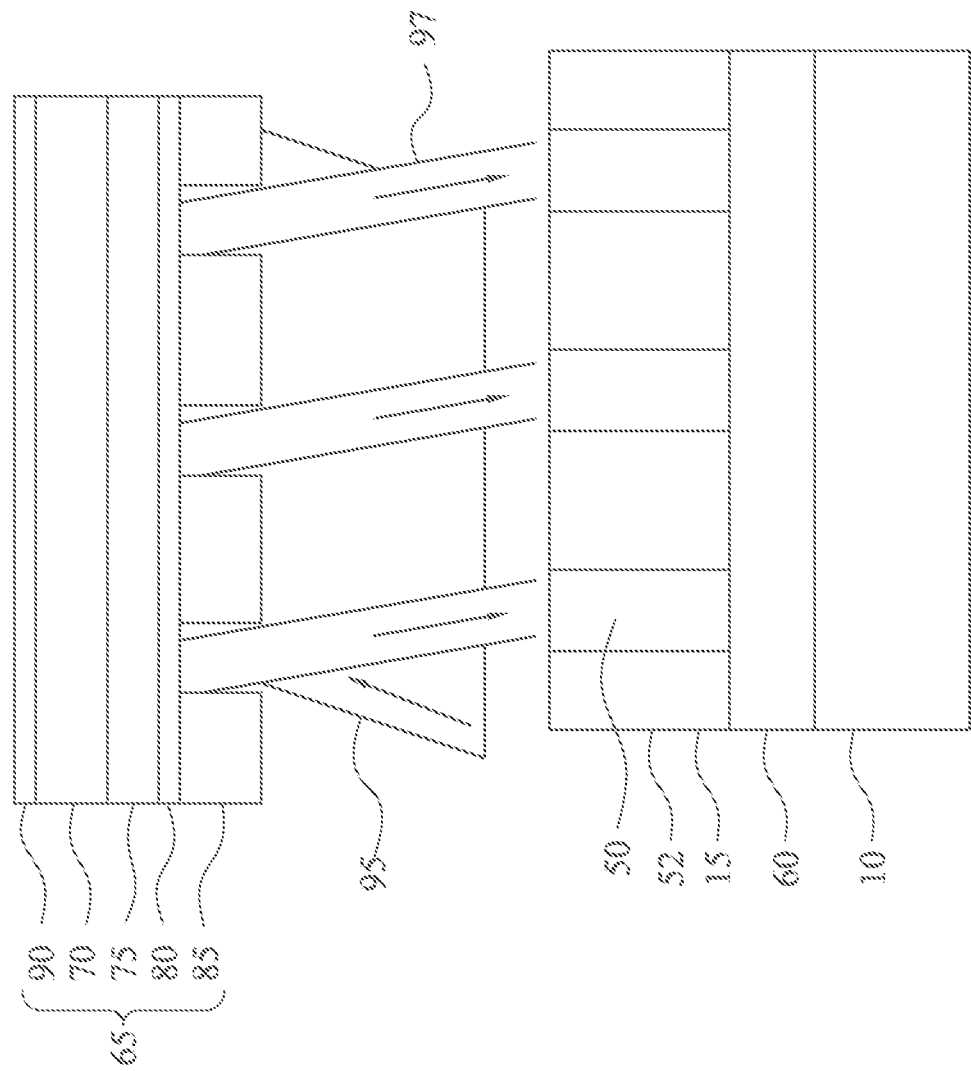

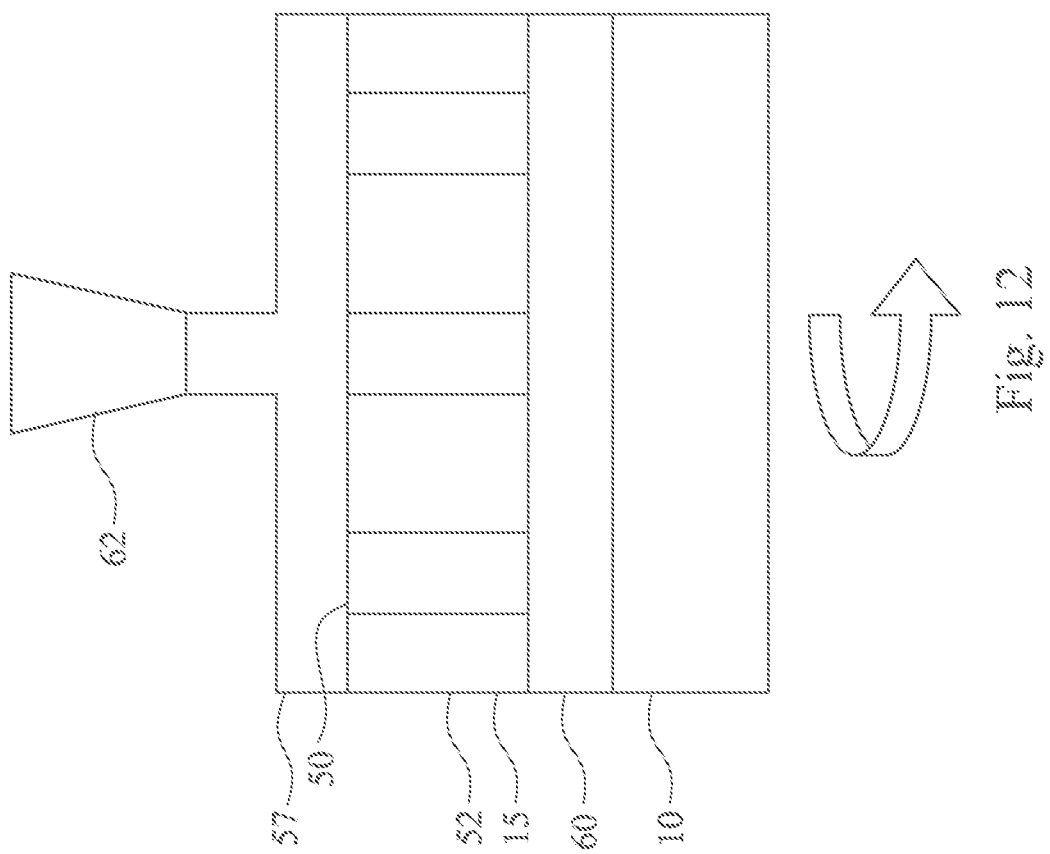

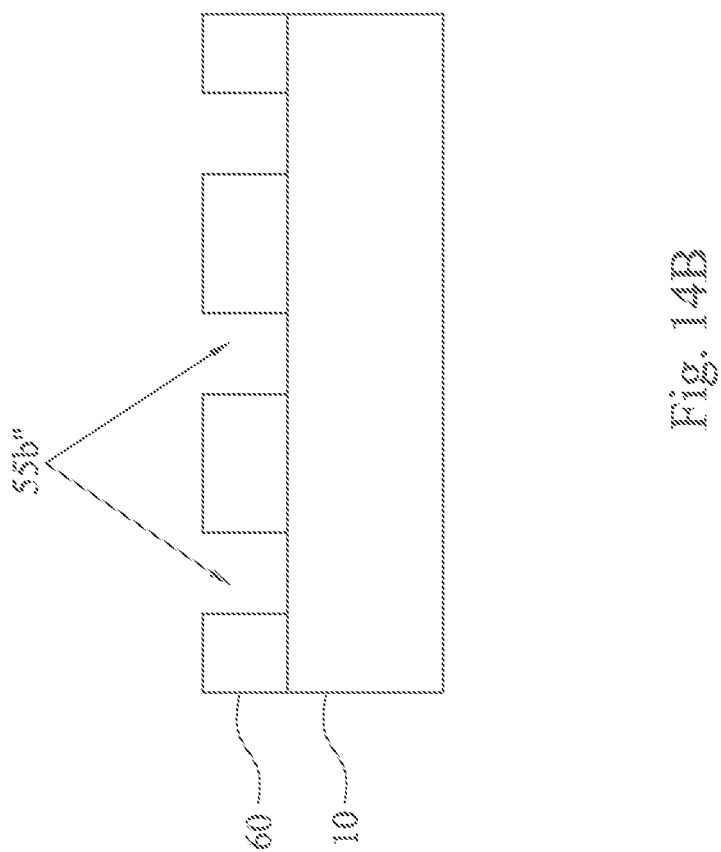

PHOTORESIST COMPOSITION AND METHOD OF FORMING PHOTORESIST PATTERN

CROSS-REFERENCE TO RELATED APPLICATIONS

This application claims priority to U.S. Provisional Patent Application No. 62/941,486, filed Nov. 27, 2019, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL an increase in wafer exposure throughput is desirable. Wafer exposure throughput can be improved through increased exposure power or increased resist photospeed. Low exposure dose may lead to reduced line width resolution and reduced critical dimension uniformity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 shows a process stage of a sequential operation according to an embodiment of the disclosure.

FIGS. 4A and 4B show a process stage of a sequential operation according to an embodiment of the disclosure.

FIG. 5 shows a process stage of a sequential operation according to an embodiment of the disclosure.

FIGS. 6A and 6B show a process stage of a sequential operation according to an embodiment of the disclosure.

FIGS. 7A and 7B show a process stage of a sequential operation according to an embodiment of the disclosure.

FIGS. 9A and 9B show the preparation of metallic core/ligand complexes according to some embodiments of the disclosure.

FIGS. 11A and 11B show a process stage of a sequential operation according to an embodiment of the disclosure.

FIG. 12 shows a process stage of a sequential operation according to an embodiment of the disclosure.

FIGS. 14A and 14B show a process stage of a sequential operation according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
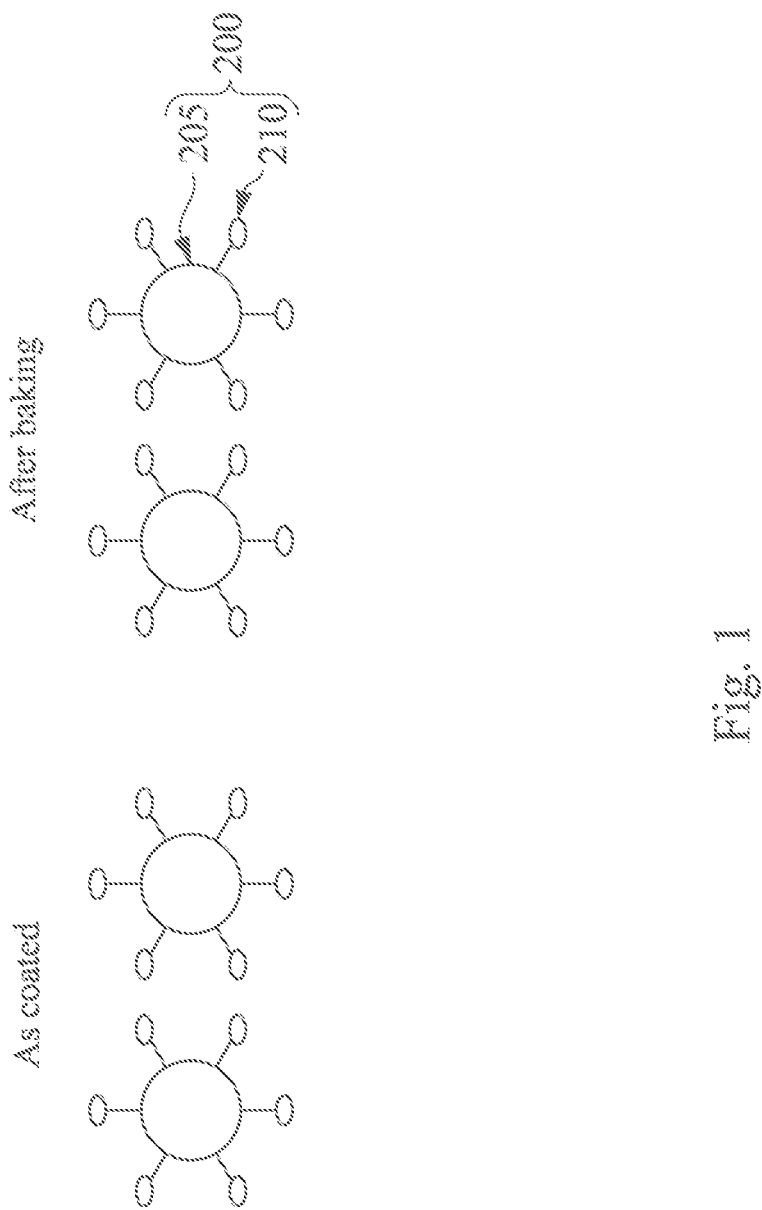
FIG. 1 illustrates baking metallic cores and ligands in a resist composition.

Metal-containing photoresists are desirable as high-sensitivity and high-etching selectivity photoresists. The metal particles in the metal-containing photoresists absorbs high energy photons, such as extreme ultraviolet EUV photons. Metal containing photoresists include metal particles and ligands to complex the metal particles. In some embodiments, the metal particles are nanoparticles, and in some embodiments, the metal particles are metal oxide particles. FIG. 1 illustrates a metallic core 205 including one or more metal nanoparticles complexed by a plurality of ligand units 210 forming a ligand-complexed metallic core 200. During baking of the photoresist layer, such as pre-exposure baking or post-exposure baking, the ligand units 210 can condense, which may result in the formation of scum residue in the photoresist pattern after development. A thermally stable ligand is desirable to prevent the ligand from condensing during baking operations and inhibit scum formation in the photoresist pattern. As shown in FIG. 1, after baking the ligand-complexed metallic cores 200 remain separated because the thermally stable ligands have not condensed during the baking operation.

Figure 2:
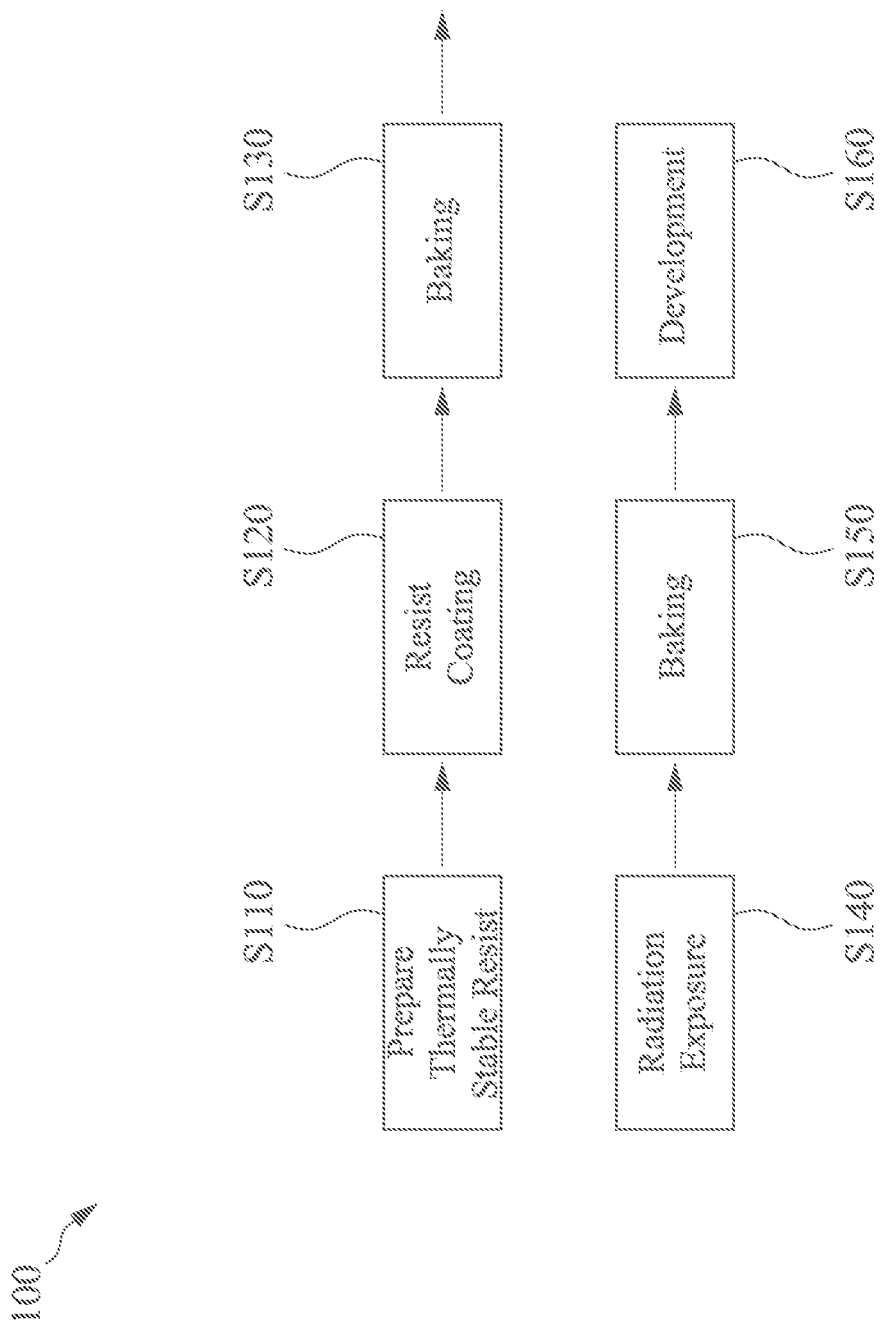
FIG. 2 illustrates a process flow of manufacturing a semiconductor device according to embodiments of the disclosure.

FIG. 2 illustrates a process flow 100 of manufacturing a semiconductor device according to embodiments of the disclosure. In operation S110, a resist composition is prepared. In some embodiments, the resist is a thermally stable photoresist. In some embodiments, the thermally stable resist composition is prepared by introducing a thermally stable ligand into a metal-containing photoresist composition. In other embodiments, a thermally stable ligand is mixed with another different ligand and together the two different ligands form a complex of the metallic cores and the ligands.

The resist composition is coated on a surface of a layer to be patterned or a substrate 10 in operation S120, in some embodiments, to form a resist layer 15, as shown in FIG. 3. In some embodiments, the resist layer 15 is a photoresist layer. Then the resist layer 15 undergoes a first baking operation S130 to evaporate solvents in the resist composition in some embodiments. The resist layer 15 is baked at a temperature and time sufficient to cure and dry the resist layer 15 (pre-baking). In some embodiments, the resist layer is heated to a temperature of about 40° C. to 120° C. for about 10 seconds to about 10 minutes.

After the first (or pre-) baking operation S130, the photoresist layer 15 is selectively exposed to actinic radiation 45/97 (see FIGS. 4A and 4B) in operation S140. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the actinic radiation is an electron beam.

Figure 4A:
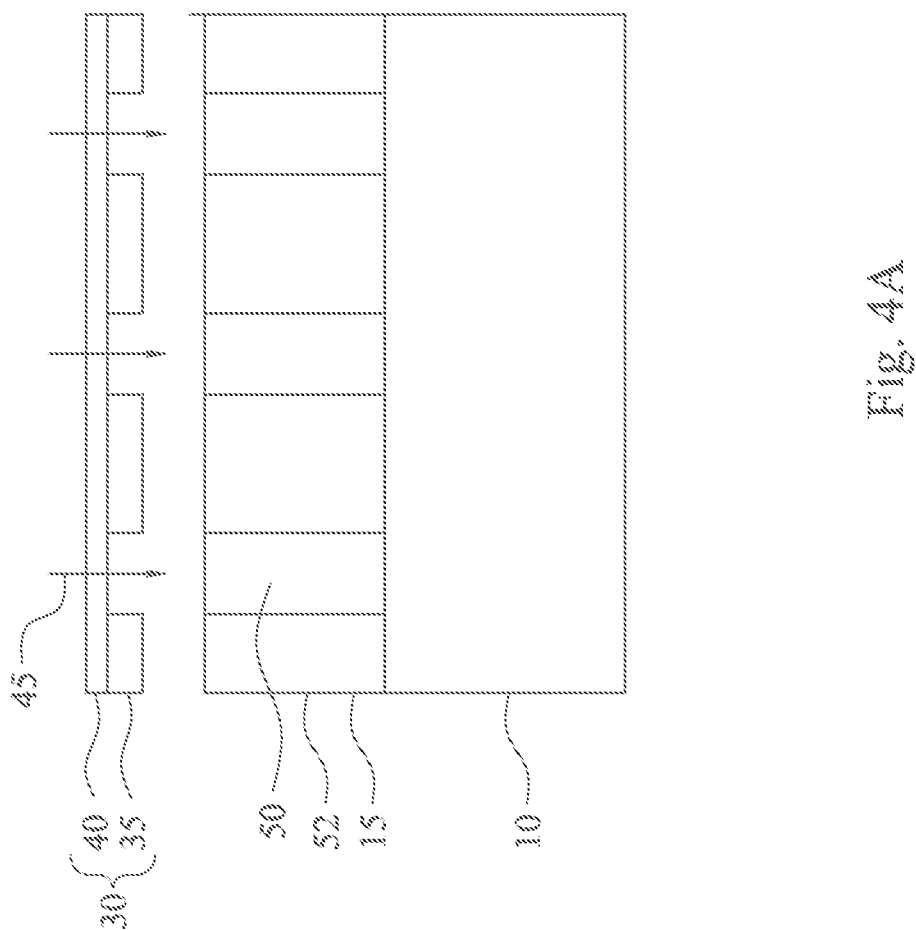

As shown in FIG. 4A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 4B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

The region of the photoresist layer exposed to radiation (exposed region 50) undergoes a chemical reaction thereby changing its solubility in a subsequently applied developer relative to the region of the photoresist layer not exposed to radiation (unexposed region 52). In some embodiments, the region of the photoresist layer exposed to radiation (exposed region 50) undergoes a crosslinking reaction.

Next, the photoresist layer 15 undergoes a second baking operation (or post-exposure bake) in operation S150. In some embodiments, the photoresist layer 15 is heated to a temperature of about 70° C. to 160° C. for about 20 seconds to about 120 seconds. The post-exposure baking may be used in order to assist in the generating, dispersing, and reacting of the acid/base/free radical generated from the impingement of the radiation 45/97 upon the photoresist layer 15 during the exposure. Such assistance helps to create or enhance chemical reactions which generate chemical differences between the exposed region 50 and the unexposed region 52 within the photoresist layer. These chemical differences also cause differences in the solubility between the exposed region 50 and the unexposed region 52.

Figure 6A:
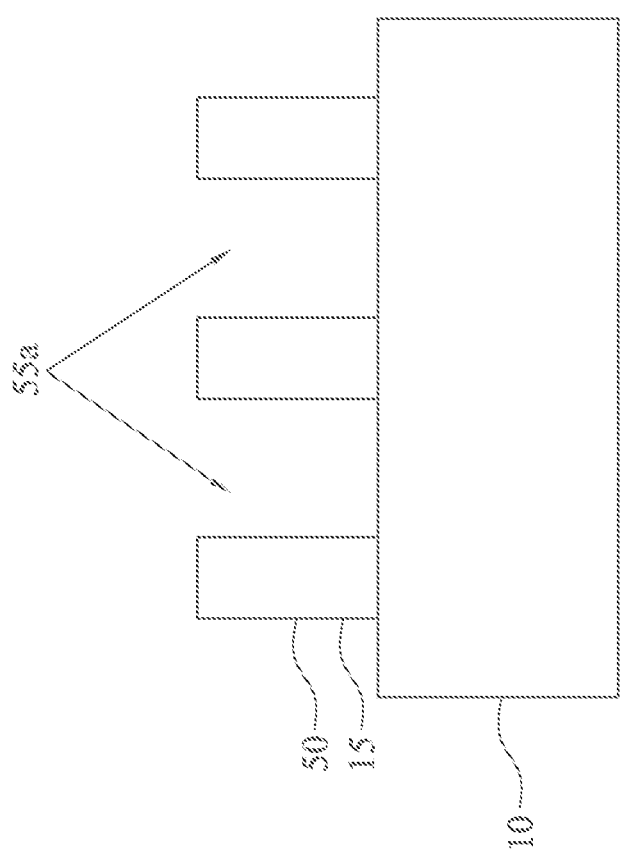

The selectively exposed photoresist layer is subsequently developed by applying a developer to the selectively exposed photoresist layer in operation S160. As shown in FIG. 5, a developer 57 is supplied from a dispenser 62 to the photoresist layer 15. In some embodiments, where the photoresist is a negative-tone resist, the unexposed region 52 of the photoresist layer is removed by the developer 57 forming a pattern of openings 55a in the photoresist layer 15 to expose the substrate 10, as shown in FIG. 6A. In other embodiments, where the photoresist is a positive-tone resist, the exposed region 50 of the photoresist layer is removed by the developer 57 forming a pattern of openings 55b in the photoresist layer 15 to expose the substrate 10, as shown in FIG. 6B.

Figure 7B:
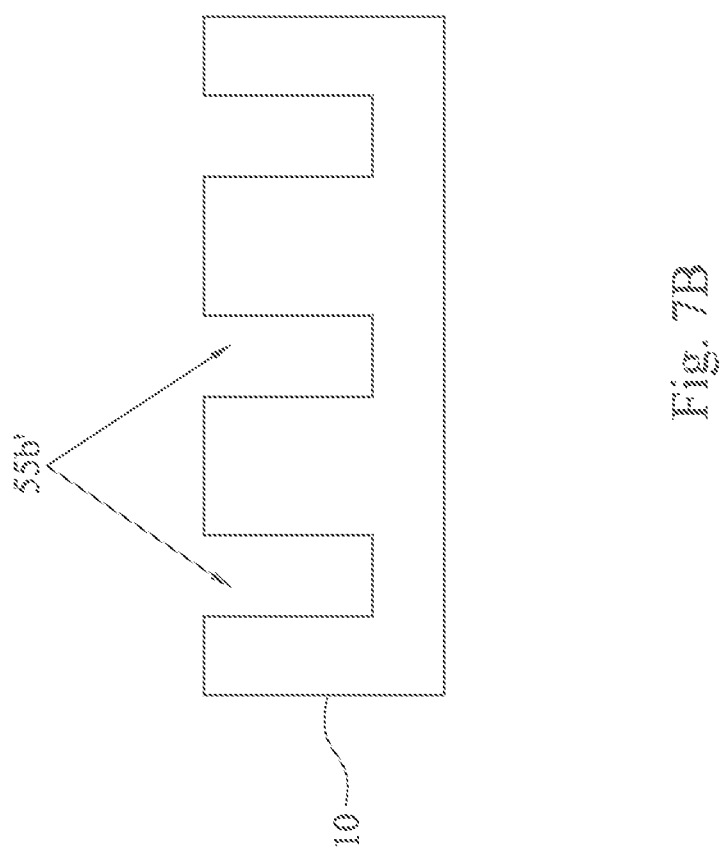

In some embodiments, the pattern of openings 55a, 55b in the photoresist layer 15 are extended into the layer to be patterned or substrate 10 to create a pattern of openings 55a', 55b' in the substrate 10, thereby transferring the pattern in the photoresist layer 15 into the substrate 10, as shown in FIGS. 7A and 7B. The pattern is extended into the substrate by etching, using one or more suitable etchants. The portion of the photoresist layer 15 remaining after the development operation is at least partially removed during the etching operation in some embodiments. In other embodiments, the remaining photoresist layer 15 is removed after etching the substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and/or InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, or combinations thereof.

In some embodiments, the substrate 10 refers to any underlying layers over which a resist layer is formed. The substrate 10 is subsequently patterned using photolithographic and etching operations.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive-tone resists or negative tone-resists. A positive-tone resist refers to a photoresist material that when exposed to radiation, such as UV light, becomes soluble in a developer, while the region of the photoresist that is non-exposed (or exposed less) is insoluble in the developer. A negative-tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive-tone or negative-tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative-tone photoresists developed with the TMAH solution, the unexposed regions of the photoresist are removed by the TMAH, and the exposed regions of the photoresist, that undergo cross-linking upon exposure to actinic radiation, remain on the substrate after development.

Resist compositions according to the present disclosure are metal-containing resists. The metal-containing resists of the present disclosure include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof. In some embodiments, the metal particles include one or more selected from the group consisting of Ce, Ba, La, Ce, In, Sn, Ag, Sb, and oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a thermally stable ligand (or first ligand), wherein the thermally stable ligand includes branched or unbranched, cyclic or non-cyclic, saturated organic groups, including C1-C7 alkyl groups or C1-C7 fluoroalkyl groups. The C1-C7 alkyl groups or C1-C7 fluoroalkyl groups include one or more substituents selected from the group consisting of —$CF_3$, —SH, —OH, =O, —S—, —P—, —$PO_2$, —C(=O)SH, —C(=O)OH, —C(=O)O—, —O—, —N—, —C(=O)NH, —$SO_2$OH, —$SO_2$SH, —SOH, and —$SO_2$—. In some embodiments, the thermally stable ligand includes one or more substituents selected from the group consisting of —$CF_3$, —OH, —SH, and —C(=O)OH substituents. Thermally stable ligands are ligands that do not substantially react with each other or condense during pre-exposure baking or post-exposure baking.

Figure 8A:
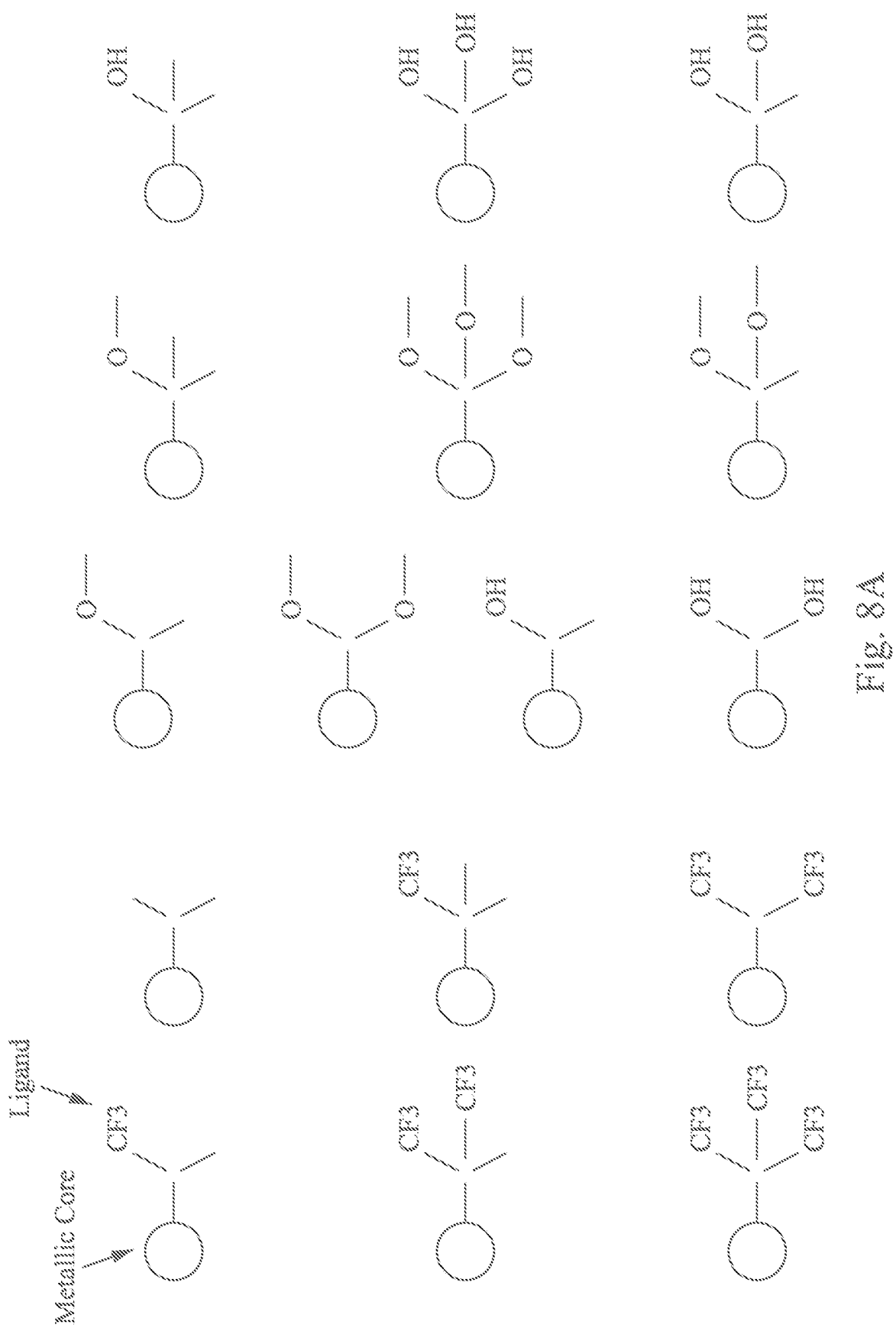
FIGS. 8A and 8B show resist composition ligand components according to some embodiments of the disclosure.
Figure 8D:
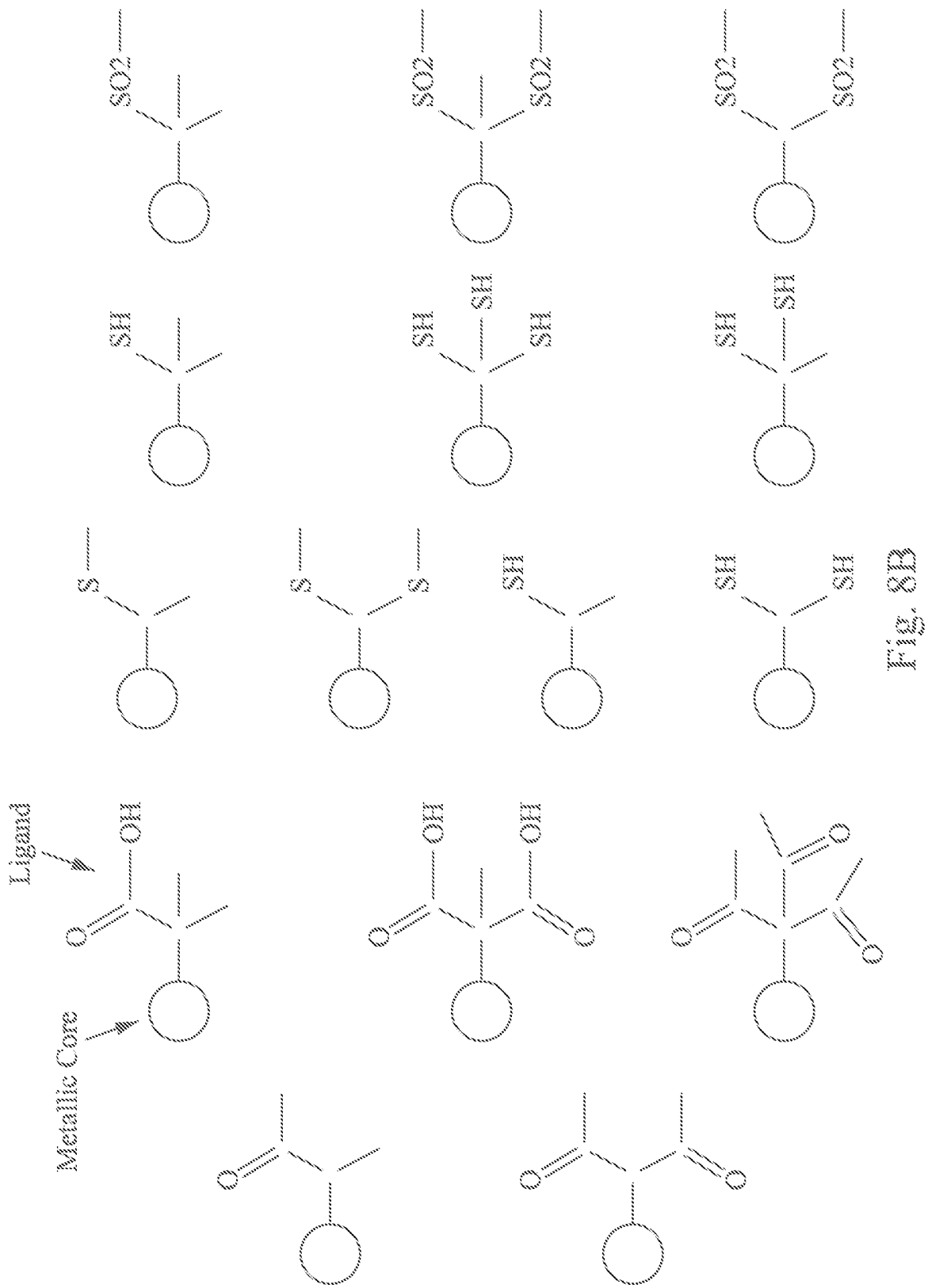

Examples of the C1-C7 thermally stable ligands are shown in FIGS. 8A and 8B. The thermally stable ligands are attached to a metallic core. If the number of carbon atoms in the thermally stable ligand is greater than 7, the ligand may impair extreme ultraviolet radiation absorption.

In some embodiments, the metal particles are complexed with a second ligand. The second ligand is not the same as the first or thermally stable ligand. In some embodiments, the second ligand is a carboxylic acid or sulfonic acid ligand. For example, in some embodiments, the second ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, the second ligand is a branched or unbranched, aliphatic or aromatic, substituted or unsubstituted carboxylic acid or sulfonic acid ligand, wherein when the second ligand is substituted the substituent selected from one or more of a C1-C9 alkyl group, a C2-C9 alkenyl group, or a C6-C9 phenyl group.

In some embodiments, the concentration of the thermally stable ligand in the resist composition ranges from 7 wt. % to 99 wt. % based on a total weight of the thermally stable ligand and the second ligand. In some embodiments, the concentration of the thermally stable ligand ranges from 15 wt. % to 85 wt. % based on a total weight of the thermally stable ligand and the second ligand.

In some embodiments, each metal particle is complexed by 1 to 25 ligand units. In some embodiments, each metal particle is complexed by 3 to 18 ligand units.

In some embodiments, the resist composition includes about 0.1 wt. % to about 20 wt. % of the thermally stable and second ligands based on the total weight of the resist composition. In some embodiments, the resist includes about 1 wt. % to about 10 wt. % of the thermally stable and second ligands. In some embodiments, the ligand concentration is about 10 wt. % to about 40 wt. % based on the weight of the metal particles and the weight of the ligands. Below about 10 wt. % ligand, the organometallic photoresist does not function well. Above about 40 wt. % ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

The resist composition solvent can be any suitable solvent. In some embodiments, the solvent is one or more of propylene glycol methyl ether acetate (PGMEA), propylene glycol monomethyl ether (PGME), 1-ethoxy-2-propanol (PGEE), 7-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), or 2-heptanone (MAK).

FIGS. 9A and 9B show the preparation of metallic core/ligand complexes according to some embodiments of the disclosure. Example A in FIG. 9A shows a plurality of metallic cores with an attached second ligand mixed with a plurality of metallic cores with an attached thermally stable ligand. The metallic cores and ligands are synthesized to form a thermally stable metallorganic complex. Example B in FIG. 9B is similar to Example A. In Example B, two thermally stable metallorganic complexes are bound to each other to create a larger, thermally stable complex.

Resist compositions according to embodiments of the disclosure include metal particles complexed by the thermally stable ligands in a solvent. Some embodiments further include the second ligand.

In some embodiments, the metallic core/ligand complexes are formed by mixing the metallic particles with the ligands. In some embodiments, the metallic core/ligand complexes are formed spontaneously upon mixing the metallic particles with the ligands. In other embodiments, the mixture of metallic particles and ligands are heated to a temperature of about 80° C. to about 150° C. for about 30 seconds to about 240 seconds to form the metallic core/ligand complexes.

In some embodiments, resist compositions according to embodiments of the disclosure, such as a photoresist include a polymer or a polymerizable monomer or oligomer along with one or more photoactive compounds (PACs). In some embodiments, the concentration of the polymer, monomer, or oligomer ranges from about 1 wt. % to about 75 wt. % based on the total weight of the resist composition. In other embodiments, the concentration of the polymer, monomer, or oligomer ranges from about 5 wt. % to about 50 wt. %. At concentrations of the polymer, monomer, or oligomer below the disclosed ranges the polymer, monomer, or oligomer has negligible effect on the resist performance. At concentrations above the disclosed range there is no substantial improvement in resist performance or there is degradation in the formation of consistent resist layers.

In some embodiments, the polymerizable monomer or oligomer includes an acrylic acid, an acrylate, a hydroxystyrene, or an alkylene. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the polymer is a polyhydroxystyrene, a polymethyl methacrylate, or a polyhydroxystyrene-t-butyl acrylate, e.g.—

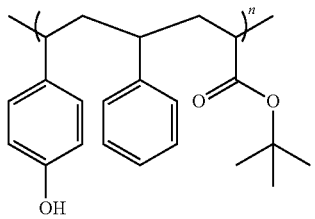

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclodecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl) methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like.

Some embodiments of the photoresist include one or more photoactive compounds (PACs). The PACs are photoactive components, such as photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis (dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p- methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer; combinations of these, or the like.

In some embodiments, the PAC includes a quencher. In some embodiments, the quenchers include photobase generators and photo decomposable bases. In embodiments in which the PACs are photobase generators (PBG), the PBGs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

In some embodiments in which the PACs are photo decomposable bases (PBD), the PBDs include triphenylsulfonium hydroxide, triphenylsulfonium antimony hexafluoride, or triphenylsulfonium triflate.

In some embodiments, the concentration of the photoactive compound ranges from about 0.1 wt. % to about 20 wt. % based on the total weight of the resist composition. In other embodiments, the concentration of the photoactive compound ranges from about 1 wt. % to about 15 wt. %. At concentrations of the photoactive compound below the disclosed ranges the photoactive compound has negligible effect on the resist performance. At concentrations above the disclosed range there is no substantial improvement in resist performance.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

Other additives to the photoresist composition, in some embodiments, include a quencher for neutralizing excessive acid formed by photoacid generators. Another additive in some embodiments, is a stabilizer, which assists in preventing undesired diffusion of the acids generated during exposure of the photoresist. Another additive in some embodiments of the photoresist is a dissolution inhibitor to help control dissolution of the photoresist during development. Another additive in some embodiments of the photoresist is a plasticizer. Plasticizers may be used to reduce delamination and cracking between the photoresist and underlying layers (e.g., the layer to be patterned). A coloring agent is another additive included in some embodiments of the photoresist. The coloring agent observers examine the photoresist and find any defects that may need to be remedied prior to further processing. Adhesion additives are added to some embodiments of the photoresist to promote adhesion between the photoresist and an underlying layer upon which the photoresist has been applied (e.g., the layer to be patterned). Surface leveling agents are added to some embodiments of the photoresist to assist a top surface of the photoresist to be level, so that impinging light will not be adversely modified by an unlevel surface.

In some embodiments, the polymer, monomer, or oligomer, and the PACs, along with any desired additives or other agents, are added to the solvent for application. Once added, the mixture is then mixed in order to achieve a homogenous composition throughout the photoresist to ensure that there are no defects caused by uneven mixing or nonhomogenous composition of the photoresist. Once mixed together, the photoresist may either be stored prior to its usage or used immediately.

Once ready, the photoresist is applied onto the layer to be patterned, as shown in FIG. 3, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-bake of the photoresist layer is performed in some embodiments to cure and dry the photoresist prior to radiation exposure (see FIG. 2). The curing and drying of the photoresist layer 15 removes solvent while leaving behind the metallorganic, and the optional polymer, monomer, oligomer, photoactive compound, and the other chosen additives. In some embodiments, the pre-baking is performed at a temperature suitable to evaporate the solvent, such as between about 40° C. and 120° C., although the precise temperature depends upon the materials chosen for the photoresist. The pre-baking is performed for a time sufficient to cure and dry the photoresist layer, such as between about 10 seconds to about 10 minutes.

FIGS. 4A and 4B illustrate selective exposures of the photoresist layer to form an exposed region 50 and an unexposed region 52. In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 15, and the radiation is absorbed by the metal particles or the photoactive compound in order to induce a reaction in the photoresist layer to chemically alter those regions of the photoresist layer to which the radiation 45/97 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45, a post-exposure baking is performed in some embodiments to further the reaction initiated during the selective exposure to actinic radiation. In some embodiments including a photoactive compound, the post-exposure baking assists in the generating, dispersing, and reacting of the acid/base/free radical generated from the impingement of the radiation 45 upon the PACs during the exposure. Such thermal assistance helps to create or enhance chemical reactions which generate chemical differences between the exposed region 50 and the unexposed region 52 within the photoresist layer 15. These chemical differences also cause differences in the solubility between the exposed region 50 and the unexposed region 52. In some embodiments, the post-exposure baking occurs at temperatures ranging from about 70° C. to about 160° C. for a period of between about 20 seconds and about 120 seconds.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer includes an solvent selected from the group consisting of propylene glycol methyl ether acetate (PGMEA), propylene glycol monomethyl ether (PGME), 1-ethoxy-2-propanol (PGEE), 7-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), 2-heptanone (MAK), and isobutyl propionate. In other embodiments, the developer is an aqueous solvent, including a tetramethylammonium hydroxide (TMAH) solution.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 5. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-unexposed regions 52 of negative-tone resists to form a pattern 55a, exposing the surface of the substrate 10, as shown in FIG. 6A, leaving behind well-defined exposed photoresist regions 50, having improved definition than provided by conventional negative photoresist photolithography. In other embodiments, the developer 57 dissolves the radiation-exposed regions 50 of positive-tone resists to form a pattern 55b, exposing the surface of the substrate 10, as shown in FIG. 6B, leaving behind well-defined unexposed photoresist regions 52, having improved definition than provided by conventional negative photoresist photolithography.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer (exposed region 50, unexposed region 52) is in place. For example, an etching operation, using dry or wet etching, is performed in some embodiments, to transfer the pattern 55a, 55b of the photoresist layer to the underlying substrate 10, forming recesses 55a', 55b' as shown in FIGS. 7A and 7B. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 10:
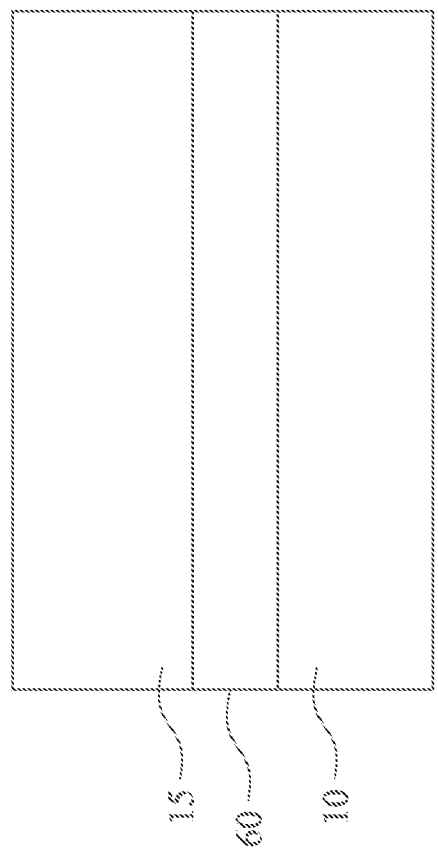
FIG. 10 shows a process stage of a sequential operation according to an embodiment of the disclosure.

In some embodiments, a layer to be patterned 60 is disposed over the substrate prior to forming the photoresist layer, as shown in FIG. 10. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 11A:
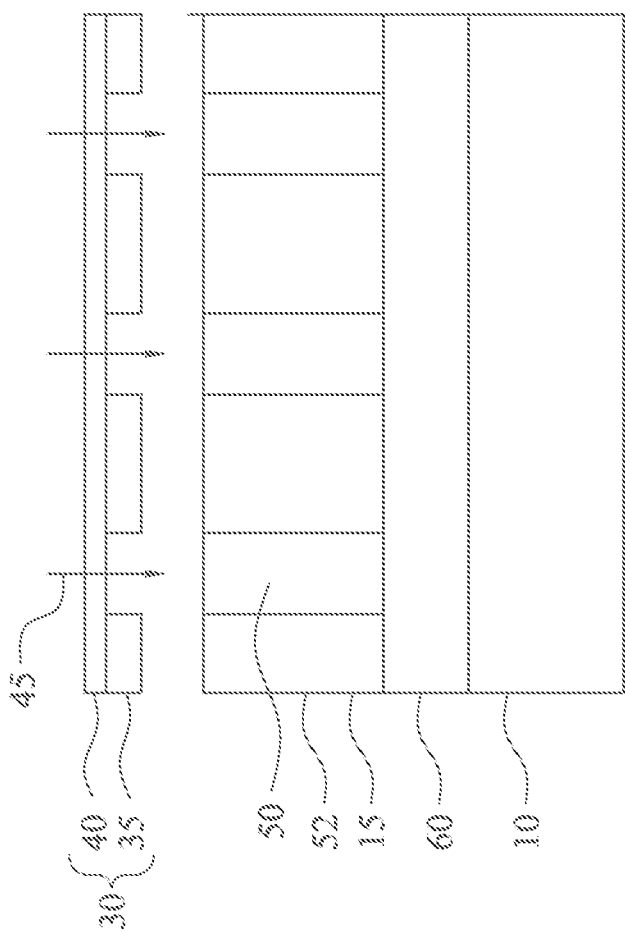

The photoresist layer 15 is subsequently selectively exposed to actinic radiation 45 to form exposed regions 50 and unexposed regions 52 in the photoresist layer, as shown in FIGS. 11A and 111B, and described herein in relation to FIGS. 4A and 4B.

Figure 13A:
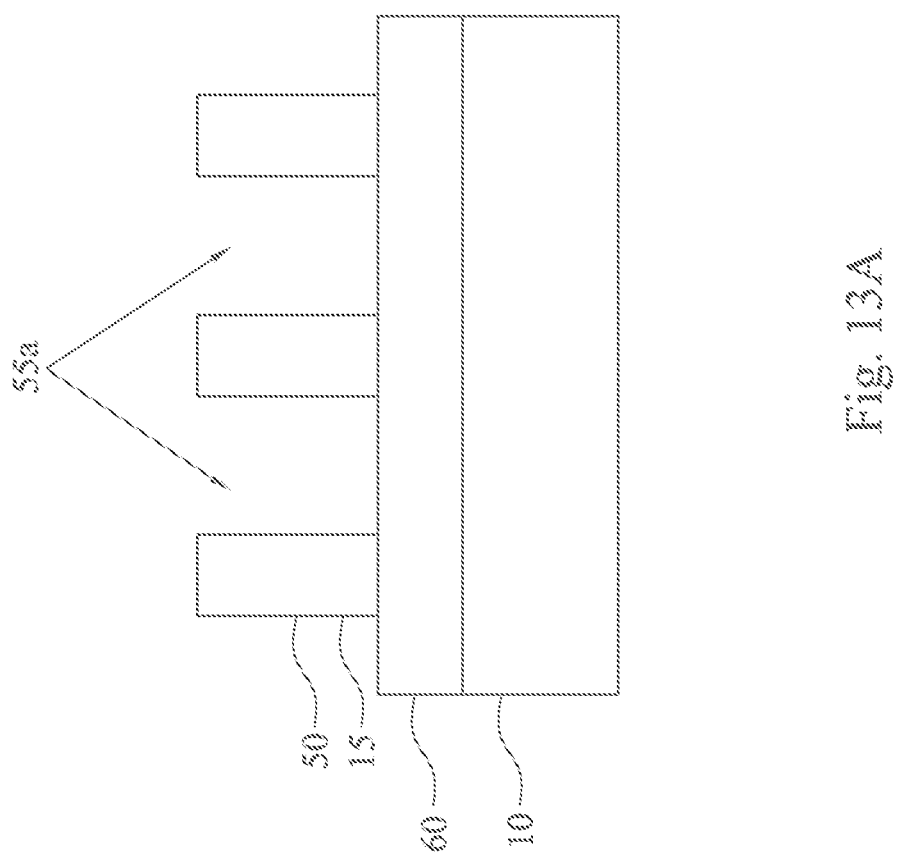
FIGS. 13A and 13B show a process stage of a sequential operation according to an embodiment of the disclosure.
Figure 13D:
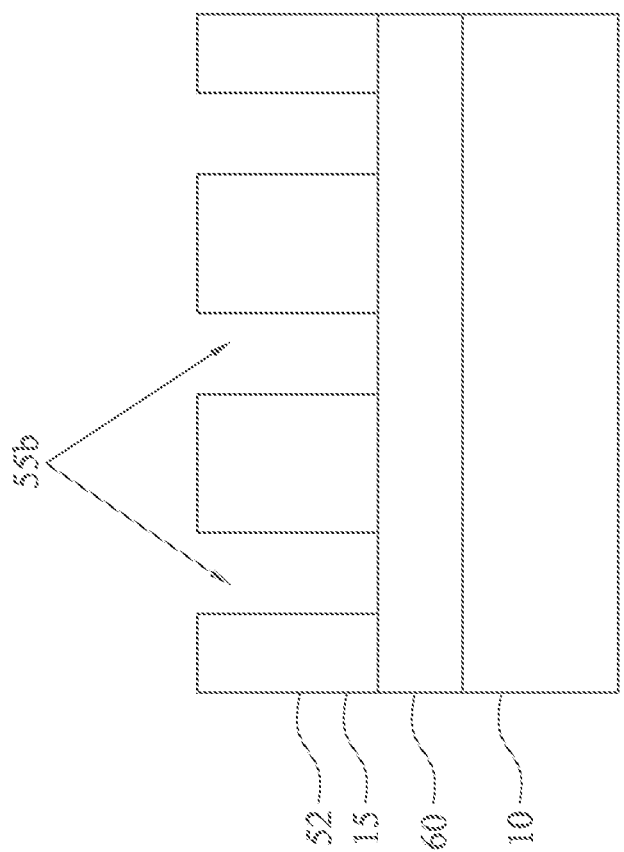

As shown in FIG. 12, the photoresist layer 15 is developed by dispensing developer 57 from a dispenser 62 to form a pattern of photoresist openings 55a, 55b, as shown in FIGS. 13A and 13B. The development operation is similar to that explained with reference to FIGS. 5-6B, herein. In some embodiments, where the photoresist is a negative-tone resist, the unexposed region 52 of the photoresist layer is removed by the developer 57 forming a pattern of openings 55a in the photoresist layer 15 to expose the substrate 10, as shown in FIG. 13A. In other embodiments, where the photoresist is a positive-tone resist, the exposed region 50 of the photoresist layer is removed by the developer 57 forming a pattern of openings 55b in the photoresist layer 15 to expose the substrate 10, as shown in FIG. 13B.

Figure 14A:
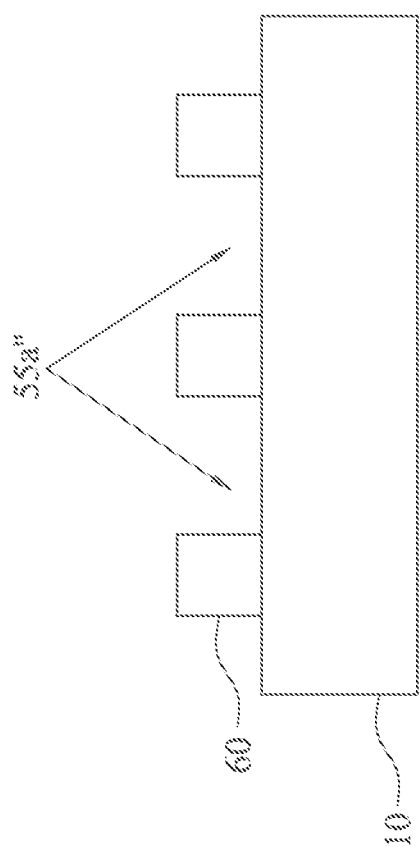

Then as shown in FIGS. 14A and 14B, the pattern 55a, 55b in the photoresist layer 15 is transferred to the layer to be patterned 60 using an etching operation and the photoresist layer is removed, as explained with reference to FIGS. 7A and 7B to form the pattern 55a″, 55b″ in the layer to be patterned 60.

The novel photoresist compositions and photolithographic patterning methods according to the present disclosure provide higher semiconductor device feature resolution and density at higher wafer exposure throughput with reduced defects in a higher efficiency process than conventional exposure techniques. The novel photoresist compositions and methods inhibit scum formation after development thereby providing improved photoresist pattern resolution. Photolithographic operations employing embodiments of the present disclosure provide a greater than 20% reduction in scum formation than photolithographic operations not employing the embodiments of the present disclosure.

An embodiment of the disclosure is a method of forming a photoresist pattern, including forming a photoresist layer including a photoresist composition over a substrate. The photoresist composition includes metal particles and a thermally stable ligand attached to the metal particles. The thermally stable ligand includes branched or unbranched, cyclic or non-cyclic, C1-C7 alkyl groups or C1-C7 fluoroalkyl groups. The C1-C7 alkyl or C1-C7 fluoroalkyl groups include one or more of $-CF_3$, $-SH$, $-OH$, $=O$, $-S-$, $-P-$, $-PO_2$, $-C(=O)SH$, $-C(=O)OH$, $-C(=O)O-$, $-O-$, $-N-$, $-C(=O)NH$, $-SO_2OH$, $-SO_2SH$, $-SOH$, or $-SO_2-$. The photoresist layer is selectively exposed to actinic radiation, and the photoresist layer is developed to form a pattern in the photoresist layer. In an embodiment, the method includes heating the photoresist layer before selectively exposing the photoresist layer to actinic radiation. In an embodiment, the actinic radiation is an electron beam or extreme ultraviolet radiation. In an embodiment, the method includes heating the selectively exposed photoresist layer before developing the photoresist layer. In an embodiment, the metal particles are nanoparticles. In an embodiment, the metal particles include metal oxides. In an embodiment, the metal particles include one or more of titanium, zinc, zirconium, nickel, cobalt, manganese, copper, iron, strontium, tungsten, vanadium, chromium, tin, hafnium, indium, cadmium, molybdenum, tantalum, niobium, aluminum, cesium, barium, lanthanum, cerium, silver, antimony, combinations thereof, or oxides thereof. In an embodiment, the photoresist composition includes one or more solvents selected from propylene glycol methyl ether acetate (PGMEA), propylene glycol monomethyl ether (PGME), 1-ethoxy-2-propanol (PGEE), 7-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), or 2-heptanone (MAK). In an embodiment, the photoresist composition includes a second ligand attached to the metal particles, wherein the second ligand is a different material than the thermally stable ligand. In an embodiment, the second ligand is a branched or unbranched, aliphatic or aromatic, substituted or unsubstituted carboxylic acid or sulfonic acid ligand, wherein when the second ligand is substituted with a substituent selected from one or more of a C1-C9 alkyl group, a C2-C9 alkenyl group, a C6-C9 phenyl group, or combinations thereof.

Another embodiment of the disclosure is a method of manufacturing a semiconductor device, including forming a resist layer over a substrate, and forming a latent pattern in the resist layer. A pattern is formed in the resist layer by removing a portion of the resist layer, and the pattern in the resist layer is extended into the substrate. The resist layer includes metal cores and a first ligand attached to the metal core. The first ligand includes branched or unbranched, cyclic or non-cyclic, saturated C1-C7 organic groups, wherein the C1-C7 organic groups include H or F, and one or more of $-CF_3$, $-SH$, $-OH$, $=O$, $-S-$, $-P-$, $-PO_2$, $-C(=O)SH$, $-C(=O)OH$, $-C(=O)O-$, $-O-$, $-N-$, $-C(=O)NH$, $-SO_2OH$, $-SO_2SH$, $-SOH$, and $-SO_2-$. In an embodiment, the extending the pattern into the substrate comprises etching the substrate. In an embodiment, the method includes heating the resist layer at a temperature of 70° C. to 160° C. after the forming a latent pattern and before the forming a pattern. In an embodiment, the method includes heating the resist layer at a temperature of 40° C. to 120° C. before the forming a latent pattern. In an embodiment, the resist layer includes a second ligand attached to the metal cores, wherein the second ligand is formed of a different material than the first ligand. In an embodiment, the forming the resist layer includes depositing a resist composition over the substrate, wherein the resist composition includes: the metal cores, the first ligand attached to the metal cores, and a solvent. The concentration of the metal particles ranges from 0.5 wt. % to 15 wt. % based on a weight of the solvent and the metal cores. In an embodiment, the concentration of the metal cores ranges from 1 wt. % to 7 wt. % based on the weight of the solvent and the metal cores. In an embodiment, the forming the latent pattern in the resist layer includes patternwise exposing the resist layer to extreme ultraviolet radiation or an electron beam. In an embodiment, the second ligand is a substituted or unsubstituted, branched or unbranched, aliphatic or aromatic, carboxylic acid or sulfonic acid ligand, wherein substituents are one or more of a C1-C9 alkyl group, C2-C9 alkenyl group, and a C6-C9 phenyl group.

Another embodiment of the disclosure includes a photoresist composition, including metal particles and a first ligand attached to the metal particles. The first ligand includes branched or unbranched, cyclic or non-cyclic, saturated C1-C7 organic groups, wherein the C1-C7 organic groups include H or F, and one or more of $-CF_3$, $-SH$, $-OH$, $=O$, $-S-$, $-P-$, $-PO_2$, $-C(=O)SH$, $-C(=O)OH$, $-C(=O)O-$, $-O-$, $-N-$, $-C(=O)NH$, $-SO_2OH$, $-SO_2SH$, $-SOH$, and $-SO_2-$. In an embodiment, the metal particles are nanoparticles. In an embodiment, the metal particles include one or more of titanium, zinc, zirconium, nickel, cobalt, manganese, copper, iron, strontium, tungsten, vanadium, chromium, tin, hafnium, indium, cadmium, molybdenum, tantalum, niobium, aluminum, cesium, barium, lanthanum, cerium, silver, antimony, combinations thereof, or oxides thereof. In an embodiment, the photoresist composition includes a second ligand attached to the metal particles, wherein the second ligand is a different material than the first ligand. In an embodiment, the second ligand is a branched or unbranched, aliphatic or aromatic, substituted or unsubstituted carboxylic acid or sulfonic acid ligand, wherein when the second ligand is substituted with a substituent selected from a C1-C9 alkyl group, a C2-C9 alkenyl group, a C6-C9 phenyl group, or combinations thereof. In an embodiment, the photoresist composition includes a solvent. In an embodiment, the solvent is one or more of propylene glycol methyl ether acetate (PGMEA), propylene glycol monomethyl ether (PGME), 1-ethoxy-2-propanol (PGEE), 7-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), or 2-heptanone (MAK). In an embodiment, a concentration of the metal particles ranges from 0.5 wt. % to 15 wt. % based on a weight of the solvent and the metal particles. In an embodiment, the metal particles comprise one or more of Cs, Ba, La, Ce, In, Sn, Ag, Sb, or oxides thereof. In an embodiment, the metal particles have an average particle size between 2 nm and 5 nm.

Another embodiment of the disclosure is a method of manufacturing a semiconductor device, including forming a resist layer comprising a resist composition over a substrate. A pattern is formed in the resist layer, and the pattern is extended into the substrate. The resist composition includes: a solvent, metal nanoparticles, a first ligand attached to the metal nanoparticles, and a second ligand attached to the metal nanoparticles. The first ligand includes branched or unbranched, cyclic or non-cyclic, C1-C7 alkyl groups or C1-C7 fluoroalkyl groups, wherein the C1-C7 alkyl groups or C1-C7 fluoroalkyl groups include one or more of —$CF_3$, —SH, —OH, =O, —S—, —P—, —$PO_2$, —C(=O)SH, —C(=O)OH, —C(=O)O—, —O—, —N—, —C(=O)NH, —$SO_2OH$, —$SO_2SH$, —SOH, or —$SO_2$—. The second ligand is a branched or unbranched, aliphatic or aromatic, substituted or unsubstituted carboxylic acid or sulfonic acid ligand, wherein when the second ligand is substituted with a substituent selected from one or more of a C1-C9 alkyl group, a C2-C9 alkenyl group, or a C6-C9 phenyl group, and the second ligand is a different material than the first ligand. In an embodiment, the extending the pattern into the substrate includes etching the substrate. In an embodiment, the forming the pattern includes selectively exposing the resist layer to extreme ultraviolet radiation or an electron beam; and applying a developer to the selectively exposed resist layer to remove a portion of the resist layer. In an embodiment, the method includes heating the resist layer at a temperature of 70° C. to 160° C. after the selectively exposing the resist layer. In an embodiment, the method includes heating the resist layer at a temperature of 40° C. to 120° C. before the selectively exposing the resist layer. In an embodiment, the metal nanoparticles include one or more of titanium, zinc, zirconium, nickel, cobalt, manganese, copper, iron, strontium, tungsten, vanadium, chromium, tin, hafnium, cadmium, molybdenum, tantalum, niobium, aluminum, cesium, barium, lanthanum, cerium, indium, silver, antimony, oxides thereof, or alloys thereof. In an embodiment, a concentration of the metal nanoparticles ranges from 0.5 wt. % to 15 wt. % based on the weight of the solvent and the metal nanoparticles. In an embodiment, the resist composition includes a second ligand, wherein the second ligand is a different material than the first ligand. In an embodiment, the second ligand is a branched or unbranched, aliphatic or aromatic, substituted or unsubstituted carboxylic acid or sulfonic acid ligand, wherein when the second ligand is substituted with a substituent selected from one or more of a C1-C9 alkyl group, a C2-C9 alkenyl group, or a C6-C9 phenyl group, and combinations thereof. In an embodiment, the resist composition includes a polymer or a polymerizable monomer or oligomer.

Another embodiment of the disclosure is a resist composition, including: metal cores, a first ligand attached to the metal cores, and a second ligand attached to the metal cores. The first ligand includes branched or unbranched, cyclic or non-cyclic, C1-C7 alkyl groups or C1-C7 fluoroalkyl groups, wherein the C1-C7 alkyl groups or C1-C7 fluoroalkyl groups include one or more of —$CF_3$, —SH, —OH, =O, —S—, —P—, —$PO_2$, —C(=O)SH, —C(=O)OH, —C(=O)O—, —O—, —N—, —C(=O)NH, —$SO_2OH$, —$SO_2SH$, —SOH, or —$SO_2$—. The second ligand is a different material than the first ligand. In an embodiment, the metal cores are formed of a plurality of nanoparticles. In an embodiment, the metal cores include one or more of titanium, zinc, zirconium, nickel, cobalt, manganese, copper, iron, strontium, tungsten, vanadium, chromium, tin, hafnium, cadmium, molybdenum, tantalum, niobium, aluminum, cesium, barium, lanthanum, cerium, indium, silver, antimony, oxides thereof, or alloys thereof. In an embodiment, the resist composition includes a solvent, and a concentration of the metal cores ranges from 0.5 wt. % to 15 wt. % based on a weight of the solvent and the metal cores. In an embodiment, the concentration of the metal cores ranges from 1 wt. % to 7 wt. % based on the weight of the solvent and the metal cores. In an embodiment, the second ligand is a branched or unbranched, aliphatic or aromatic, substituted or unsubstituted carboxylic acid or sulfonic acid ligand, wherein when the second ligand is substituted with a substituent selected from one or more of a C1-C9 alkyl group, a C2-C9 alkenyl group, or a C6-C9 phenyl group. In an embodiment, a concentration of the first ligand ranges from 7 wt. % to 99 wt. % based on a total weight of the first ligand and the second ligand. In an embodiment, the concentration of the first ligand ranges from 15 wt. % to 85 wt. % based on a total weight of the first ligand and the second ligand. In an embodiment, the resist composition includes a polymer or a polymerizable monomer or oligomer. In an embodiment, the resist composition includes a photoactive compound.

Another embodiment of the disclosure is a photoresist composition, including: metal nanoparticles, a thermally stable ligand attached to the metal nanoparticles, a second ligand attached to the metal nanoparticles, and a solvent. The thermally stable ligand includes branched or unbranched, cyclic or non-cyclic, saturated C1-C7 organic groups, wherein the C1-C7 organic groups include H or F, and one or more of —$CF_3$, —SH, —OH, =O, —S—, —P—, —$PO_2$, —C(=O)SH, —C(=O)OH, —C(=O)O—, —O—, —N—, —C(=O)NH, —$SO_2OH$, —$SO_2SH$, —SOH, and —$SO_2$—. The second ligand is a branched or unbranched, aliphatic or aromatic, substituted or unsubstituted carboxylic acid or sulfonic acid ligand, wherein when the second ligand is substituted with a substituent selected from one or more of a C1-C9 alkyl group, a C2-C9 alkenyl group, or a C6-C9 phenyl groups. In an embodiment, the metal nanoparticles include one or more of titanium, zinc, zirconium, nickel, cobalt, manganese, copper, iron, strontium, tungsten, vanadium, chromium, tin, hafnium, cadmium, molybdenum, tantalum, niobium, aluminum, cesium, barium, lanthanum, cerium, indium, silver, antimony, oxides thereof, or alloys thereof. In an embodiment, a concentration of the metal nanoparticles ranges from 0.5 wt. % to 15 wt. % based on a weight of the solvent and the metal nanoparticles. In an embodiment, the concentration of the metal nanoparticles ranges from 1 wt. % to 7 wt. % based on the weight of the solvent and the metal nanoparticles. In an embodiment, a concentration of the thermally stable ligand ranges from 7 wt. % to 99 wt. % based on a total weight of the thermally stable ligand and the second ligand. In an embodiment, the concentration of the thermally stable ligand ranges from 15 wt. % to 85 wt. % based on a total weight of the thermally stable ligand and the second ligand. In an embodiment, the second ligand is a substituted or unsubstituted methacrylic acid. In an embodiment, a single metal nanoparticle is complexed by 1 to 25 ligand units. In an embodiment, the metal nanoparticles are complexed into metallic cores comprising up to 18 metal nanoparticles. In an embodiment, the photoresist composition includes a polymer or a polymerizable monomer or oligomer. In an embodiment, the photoresist composition includes a photoactive compound.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a photoresist pattern, comprising:
    forming a photoresist layer comprising a photoresist composition over a substrate,
    wherein the photoresist composition comprises:
        metal particles; and
        a thermally stable ligand attached to the metal particles;
        wherein the thermally stable ligand includes C1-C7 alkyl groups or C1-C7 fluoroalkyl groups,
        wherein the C1-C7 alkyl groups and C1-C7 fluoroalkyl groups are branched, unbranched, cyclic, or non-cyclic, and
        wherein the C1-C7 alkyl or C1-C7 fluoroalkyl groups include one or more of —$CF_3$, —SH, —S—, —P—, —$PO_2$, —C(=O)SH, —C(=O)NH, —$SO_2$OH, —$SO_2$SH, —SOH, or —$SO_2$—;
    selectively exposing the photoresist layer to actinic radiation; and
    developing the photoresist layer to form a pattern in the photoresist layer.

2. The method according to claim 1, further comprising heating the photoresist layer before selectively exposing the photoresist layer to actinic radiation.

3. The method according to claim 2, wherein the actinic radiation is an electron beam or extreme ultraviolet radiation.

4. The method according to claim 1, further comprising heating the selectively exposed photoresist layer before developing the photoresist layer.

5. The method according to claim 1, wherein the metal particles are nanoparticles.

6. The method according to claim 1, wherein the metal particles include metal oxides.

7. The method according to claim 1, wherein the metal particles include one or more of titanium, zinc, zirconium, nickel, cobalt, manganese, copper, iron, strontium, tungsten, vanadium, chromium, tin, hafnium, indium, cadmium, molybdenum, tantalum, niobium, aluminum, cesium, barium, lanthanum, cerium, silver, antimony, combinations thereof, or oxides thereof.

8. The method according to claim 1, wherein the photoresist composition further comprises one or more solvents selected from propylene glycol methyl ether acetate (PGMEA), propylene glycol monomethyl ether (PGME), 1-ethoxy-2-propanol (PGEE), 7-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), or 2-heptanone (MAK).

9. The method according to claim 1, wherein the photoresist composition further comprises a second ligand attached to the metal particles, wherein the second ligand is a different material than the thermally stable ligand.

10. The method according to claim 9, wherein the second ligand is a branched or unbranched, aliphatic or aromatic, substituted or unsubstituted carboxylic acid or sulfonic acid ligand, wherein when the second ligand is substituted with a substituent selected from one or more of a C1-C9 alkyl group, a C2-C9 alkenyl group, a C6-C9 phenyl group, or combinations thereof.

11. A method of manufacturing a semiconductor device, comprising:
    forming a resist layer over a substrate;
    forming a latent pattern in the resist layer;
    forming a pattern in the resist layer by removing a portion of the resist layer; and
    extending the pattern in the resist layer into the substrate,
    wherein the resist layer comprises:
        metal cores; and
        a first ligand attached to the metal cores,
        wherein the first ligand includes saturated C1-C7 organic groups,
        wherein the saturated C1-C7 organic groups are branched, unbranched, cyclic, or non-cyclic, and
        wherein the C1-C7 organic groups include H or F, and one or more of —$CF_3$, —SH, —S—, —P—, —$PO_2$, —C(=O)SH, —C(=O)NH, —$SO_2$OH, —$SO_2$SH, —SOH, and —$SO_2$—.

12. The method according to claim 11, wherein the extending the pattern into the substrate comprises etching the substrate.

13. The method according to claim 11, further comprising heating the resist layer at a temperature of 70° C. to 160° C. after the forming a latent pattern and before the forming a pattern.

14. The method according to claim 11, further comprising heating the resist layer at a temperature of 40° C. to 120° C. before the forming a latent pattern.

15. The method according to claim 11, wherein the resist layer further comprises a second ligand attached to the metal cores, wherein the second ligand is formed of a different material than the first ligand.

16. A method of manufacturing a semiconductor device, comprising:
    forming a resist layer comprising a resist composition over a substrate;
    forming a pattern in the resist layer;
    extending the pattern in the resist layer into the substrate,
    wherein the resist composition comprises:
        a solvent;
        metal nanoparticles;
        a first ligand attached to the metal nanoparticles,
        wherein the first ligand includes C1-C7 alkyl groups or C1-C7 fluoroalkyl groups, wherein the C1-C7 alkyl groups and C1-C7 fluoroalkyl groups are branched, unbranched, cyclic, or non-cyclic, and wherein the C1-C7 alkyl groups or C1-C7 fluoroalkyl groups include one or more of —$CF_3$, —SH, —S—, —P—, —$PO_2$, —C(=O)SH, —C(=O)NH, —$SO_2$OH, —$SO_2$SH, —SOH, or —$SO_2$—; and a second ligand attached to the metal nanoparticles, wherein the second ligand is a branched or unbranched, aliphatic or aromatic, substituted or unsubstituted carboxylic acid or sulfonic acid ligand, wherein when the second ligand is substituted with a substituent selected from one or more of a C1-C9 alkyl group, a C2-C9 alkenyl group, or a C6-C9 phenyl group, and wherein the second ligand is a different material than the first ligand.

17. The method according to claim 16, wherein the forming a pattern comprises:

selectively exposing the resist layer to extreme ultraviolet radiation or an electron beam; and applying a developer to the selectively exposed resist layer to remove a portion of the resist layer.

18. The method according to claim 16, further comprising heating the resist layer at a temperature of 70° C. to 160° C. after the selectively exposing the resist layer.

19. The method according to claim 18, further comprising heating the resist layer at a temperature of 40° C. to 120° C. before the selectively exposing the resist layer.

20. The method according to claim 16, wherein the metal nanoparticles include one or more of titanium, zinc, zirconium, nickel, cobalt, manganese, copper, iron, strontium, tungsten, vanadium, chromium, tin, hafnium, cadmium, molybdenum, tantalum, niobium, aluminum, cesium, barium, lanthanum, cerium, indium, silver, antimony, oxides thereof, or alloys thereof.

* * * * *